United States Patent [19]
Stimson et al.

[11] Patent Number: 5,712,592
[45] Date of Patent: Jan. 27, 1998

[54] RF PLASMA POWER SUPPLY COMBINING TECHNIQUE FOR INCREASED STABILITY

[75] Inventors: Bradley O. Stimson, Mountain View, Calif.; Paul W. Rummel, Lynn, Mass.

[73] Assignee: Applied Materials, Inc., Santa Clara, Calif.

[21] Appl. No.: 398,426

[22] Filed: Mar. 6, 1995

[51] Int. Cl.$^6$ .................................................. H03F 3/68
[52] U.S. Cl. .......................... 330/124 R; 315/111.51; 330/295
[58] Field of Search .................. 330/124 R, 295; 315/111.51

[56] References Cited

U.S. PATENT DOCUMENTS

| | | | |
|---|---|---|---|
| 4,629,940 | 12/1986 | Gagne et al. | 315/111.51 |
| 4,701,716 | 10/1987 | Poole | 330/124 R X |
| 4,965,527 | 10/1990 | Clark et al. | 330/124 R |
| 5,101,171 | 3/1992 | Redmond | 330/124 R |
| 5,394,061 | 2/1995 | Fujii . | |

FOREIGN PATENT DOCUMENTS

| | | | |
|---|---|---|---|
| A-2 310 656 | 12/1976 | France . | |
| B11 60 904 | 2/1962 | Germany . | |
| 194611 | 11/1982 | Japan | 330/124 R |
| 4057406 | 6/1990 | Japan . | |
| 4104603 | 4/1992 | Japan | 330/295 |
| 1497718 | 7/1989 | U.S.S.R. | 330/295 |

*Primary Examiner*—James B. Mullins
*Attorney, Agent, or Firm*—Fish & Richardson P.C.

[57] ABSTRACT

An RF power amplifier including a splitter, two branch circuits, and a combiner. The splitter has an input line receiving an RF signal, a first output line carrying a first output signal derived from the RF signal, and a second output line carrying a second output signal derived from the RF signal. A first branch circuit receives the first output signal and generates therefrom a first derived signal. A second branch circuit receives the second output signal and generates therefrom a second derived signal therefrom. The first branch circuit includes a first power amplifier and a phase shifting element. The second branch circuit includes a second power amplifier. The combiner, which has a first input receiving the first derived signal and a second input receiving the second derived signal, combines the first and second derived signals to produce a power output signal therefrom. The phase shifting element is connected between the output line of the first power amplifier and the first input of the combiner and produces a phase shift in a signal passing from the first power amplifier to the combiner relative to a signal passing from the second power amplifier to the combiner.

39 Claims, 4 Drawing Sheets

Typical Output Power Contour vs. Load Z

RF PLASMA POWER SUPPLY COMBINING TECHNIQUE FOR INCREASED STABILITY

BACKGROUND OF THE INVENTION

The application relates to RF power supplies such as are used with plasma processing chambers.

RF excited plasma chambers can exhibit an oscillation phenomenon between the RF power supply and plasma. In RF excited plasma systems, the impedance of the plasma can change rapidly. As the power supplied to the plasma changes, the impedance changes. Similarly, the RF power supply's output power will change when it experiences a change in load impedance. These changes can cooperate to cause a fast "run-away" scenario or oscillation.

The oscillation, which can be seen as amplitude modulation of the RF signal, can occur at almost any frequency that is lower than the operating frequency depending upon the manner in which the RF power supply responds to a rapid impedance (and thus rapid output power) excursion. If the 'run-away' condition is limited and impeded by a forward power or reflected protection control loop, the oscillation will appear at that loop response frequency. If the 'run-away' condition simply causes a temporary depletion of stored energy of the power amplifier of the RF power supply, the oscillation can occur at much higher frequencies.

SUMMARY OF THE INVENTION

A new configuration for the RF power supply changes how the power supply reacts to a rapidly changing nonlinear impedance. The new configuration power supply makes the maximum forward power available from the unit close to the perfect match point of 50 ohms real resistance. This stops the power supply from delivering a higher power when the plasma impedance changes, so the interaction oscillation never gets initiated.

In general, in one aspect, the invention is an RF power supply including a splitter, two branch circuits, and a combiner. The splitter has an input line receiving an RF signal, a first output line carrying a first output signal derived from the RF signal, and a second output line carrying a second output signal derived from the RF signal. A first branch circuit receives the first output signal and generates therefrom a first derived signal. A second branch circuit receives the second output signal and generates therefrom a second derived signal therefrom. The first branch circuit includes a first power amplifier and a phase shifting element. The second branch circuit includes a second power amplifier. The combiner, which has a first input receiving the first derived signal and a second input receiving the second derived signal, combines the first and second derived signals to produce a power output signal therefrom. The phase shifting element is connected between the output line of the first power amplifier and the first input of the combiner and produces a phase shift in a signal passing from the first power amplifier to the combiner relative to a signal passing from the second power amplifier to the combiner.

In general, in another aspect, the invention is using the above described power supply to supply power to a plasma processing chamber.

Preferred embodiments include the following features. The phase shift at the output of the first amplifier is sufficient to prevent an oscillatory instability in the RF power supply when supplying power to a plasma. More specifically, the phase shift is about $90°+n(180°)$, where n is an integer and assuming that a 0° combiner is used). The first branch circuit further includes a second phase shifting element connected between the first output of the splitter and the first power amplifier. The second phase shifting element produces a second phase shift which when added to the phase shift of the first mentioned phase shifting element causes the first derived signal to have a predefined phase relationship with respect to the second derived signal. The predefined phase relationship is determined by the requirements of the combiner. When using a 0° power combiner and splitter, the first mentioned phase shift and the second phase shift cause the first derived signal to be in phase with the second derived signal. For example, the first mentioned phase shift is about $90°+n(180°)+m(360°)$, where n and m are integers, and the second phase shift is about $270°+n(180°)+k(360°)$, where k is an integer. When using a 180° power combiner and a 0° splitter, the first mentioned phase shift and the second phase shift cause the first derived signal to be 180° out of phase with the second derived signal. For example, the first mentioned phase shift is about $90°+n(180°)+m(360°)$, where n and m are integers, and the second phase shift is about $90°+n(180°)+k(360°)$, where k is an integer.

Also in preferred embodiments, the phase shifting elements are segments of cable having predetermined lengths.

In general, in yet another aspect, the invention is a method of amplifying an RF signal. The method includes the steps of: splitting the RF signal into a first output signal and a second output signal; power amplifying the first output signal to produce a first amplified signal; power amplifying the second output signal to produce a second amplified signal; phase shifting the second amplified signal relative to the first amplified signal to produce a phase shifted signal; and combining the first amplified signal and the phase shifted signal to produce a power output signal therefrom.

The invention is simple to implement and it solves the oscillation problem that often occurs particularly in RF power supplies that supply power to a plasma in a plasma chamber.

Other advantages and features will become apparent from the following description of the preferred embodiment and from the claims.

DESCRIPTION OF THE PREFERRED EMBODIMENTS

Figure 1:
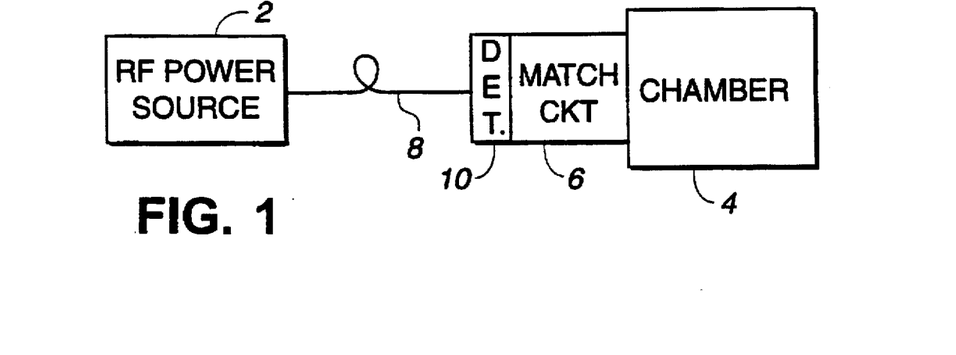
FIG. 1 shows a block diagram of an RF plasma system.

Referring to FIG. 1, the basic elements of a typical RF plasma processing system, such as might be used to fabricate semiconductor devices, include an RF power supply 2, a plasma chamber 4, and an RF match circuit 6. The RF power supply delivers an RF power signal over a coaxial cable 8 to plasma chamber 4 to generate a plasma. The cable is connected to the plasma generating elements (e.g. a coil or electrodes) within the plasma chamber through the match circuit which is preferably mounted right on the chamber close to the generating elements. The match circuit matches the impedance of the plasma chamber to the output impedance of RF power supply and the impedance of the coaxial cable, which is typically 50 ohms. Maximum power transfer into the plasma within the chamber occurs when the impedance seen by the output of the power supply is equal to 50 ohms real (i.e., purely resistive). If the impedance seen by the power supply through the coaxial cable is not the characteristic impedance of the system, e.g. 50 ohms, a mismatch will exist and some of the power sent to the chamber will reflect back to the power supply.

The match circuit, which is a conventional design, includes variable reactive elements that can be adjusted to achieve the desired match condition. A detector circuit 10, which is located within the unit that contains the match circuit, monitors the voltages and currents in the match circuit to determine whether the match circuit has achieved an optimum match condition. Typically, it does this by sampling the input current and input voltage of the match circuit and from these determine input impedance. When the detector circuit senses that the match is not optimum, it generates a signal which changes the reactive elements within the match circuit to move the circuit toward the optimum match condition.

The oscillation phenomenon that occurs between the RF power source and the plasma in the RF excited plasma chambers is not yet completely understood, but we have shown it to be caused in part by the nonlinear plasma impedance modulating the forward power of the RF power supply. As indicated above, in RF excited plasma systems, the impedance of the plasma can change rapidly and as the power supplied to the plasma changes that too can cause the plasma impedance to change. These changes in the load impedance of the power supply will, in turn, cause the RF power supply's output power to change. If the slope of the plasma impedance nonlinearity as a function of power is in the proper regime with respect to the RF power supply, the change in plasma impedance can cause a corresponding increase in the output power of the power supply which may cause a fast "run-away" scenario. The only control over this condition is the forward power control loop or mismatch protection circuit of a typical RF power supply which will eventually respond according to it's loop time constant, pulling back on the power supply output. The plasma impedance then returns to the starting point, and the process begins again, sustaining a power/impedance oscillation. The oscillation can also occur at frequencies determined by the amount of stored energy in elements of the power supply, which limit the amount of instantaneous energy available for the support of the "run-away" condition.

Since the phase and the slope of the plasma nonlinearity as seen by the power supply is a major factor, the existence of the oscillation is a function of the coaxial cable length (i.e., electrical length) between the plasma and the power supply. This has been shown repeatedly in experiments where the RF system for the chamber is stable only at specific cable lengths. Unfortunately, the cable length that is required for stable RF operation is a function of the RF matching network, the characteristics of the plasma impedance, and the characteristics of the power supply. Therefore, the optimum length is not constant from system to system. This poses a problem in a production environment.

Figure 2:
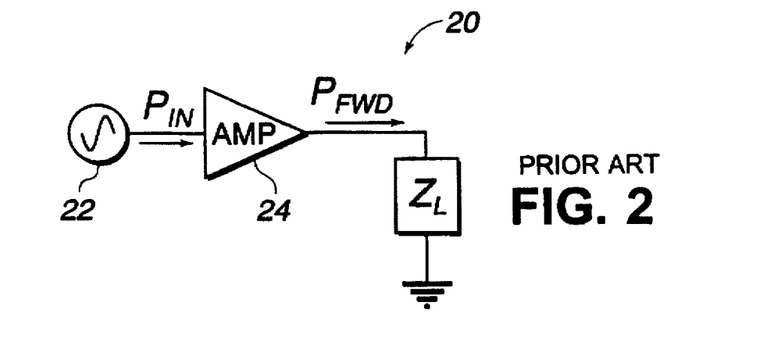
FIG. 2 shows a typical single stage RF transistor power amplifier and load.

Before describing the internal structure of the power supply design which solves the oscillation problem described above, it is useful to first obtain a more complete understanding of what causes the instability which the invention eliminates. To this end, we refer to FIG. 2 which shows the basic structure of an RF power supply 20. Power supply 20 includes a RF signal source 22 which generates an RF signal and a power amplifier 24 which amplifies the RF signal to the levels required to produce a plasma in the chamber. In this figure and in the remaining figures, the plasma in the plasma chamber is modeled as a load, $Z_L$. In its simplest form, power amplifier 24 might be a single stage RF transistor power amplifier. The forward power, $P_{FWD}$, is defined as the power incident to the load, $Z_L$. For such a system, typical characteristics of the forward power versus $Z_L$ are presented in the Smith chart shown in FIG. 3a.

As background, the Smith chart is a convenient tool widely used by persons skilled in the art to analyze RF transmission line circuits. In short, it is a graphical plot of normalized resistance and reactance functions in the reflection coefficient plane (i.e., the $\gamma$-plane). The reflection coefficient, $\gamma$, is defined as the ratio of the complex amplitudes of the reflected voltage and incident voltage at a load $Z_L$ that terminates a loss-less transmission line having a characteristic impedance of $Z_O$. Mathematically, it is expressed as follows:

$$\Gamma = \frac{Z_L - Z_O}{Z_L + Z_O} = |\Gamma|e^{j\theta_r} = \Gamma_r + j\Gamma_i.$$

where $j=(-1)^{1/2}$. The Smith chart, an example of which is shown in FIG. 3b, is a plot in $\gamma$-space, with the horizontal axis representing $\gamma_r$ and the vertical axis representing $\gamma_i$. Another useful quantity, which is referred to as normalized load $Z_L/Z_O$, is equal to:

$$z_L = \frac{Z_L}{Z_O} = r + jx.$$

Different values of r when plotted in the Smith chart appear as a family of circles of different radii with their centers located along the $\gamma_r$ axis and all passing through $\gamma=1.0 \angle 0°$. Different values of x when plotted in the Smith chart appear as another family of circles of different radii with their centers located along the $\gamma_r=1$ line and all passing through $\gamma=1.0$. Thus, the Smith chart makes it very easy to map load impedance into reflection coefficient and vice versa. As will become apparent shortly, it also makes it very easy to quickly determine the effect that a delay line or a phase shifter has on the impedance seen by the power amplifier.

Figure 3A:
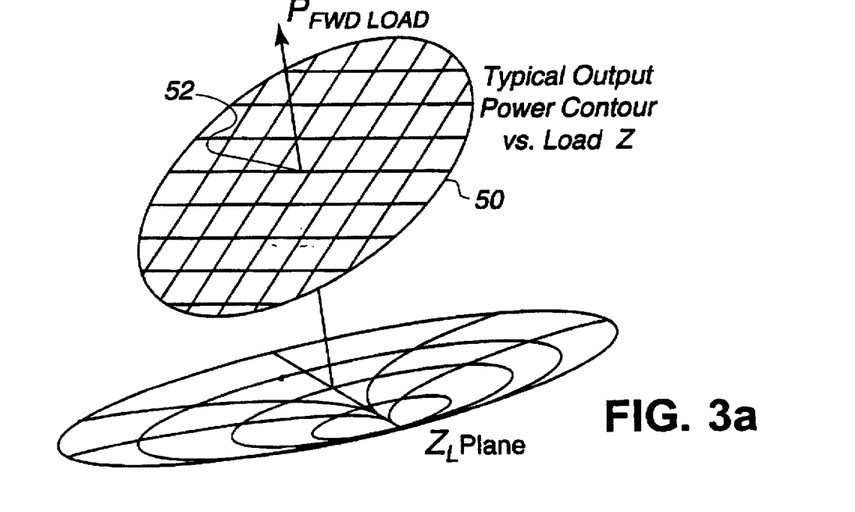
FIG. 3a shows the forward power output of a typical RF transistor amplifier versus load impedance.
Figure 3B:
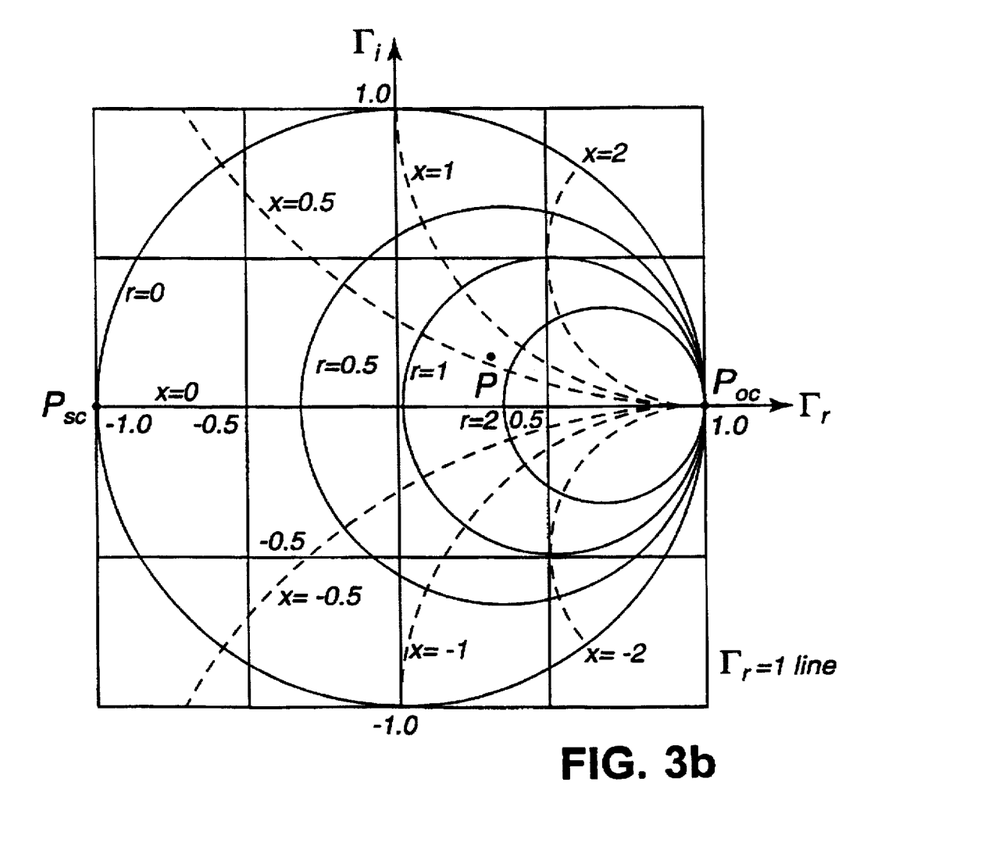
FIG. 3b is a Smith chart.

With that background, we return to power curve shown in FIG. 3a. The center of the Smith chart is equal to the transmission line characteristic impedance and power supply output impedance $Z_O$, which in this case is 50 ohms real. The vertical axis, which is perpendicular to the $\gamma$-plane (also referred to as the Z-plane), is the $P_{FWD}$ axis. A plot of the forward power, $P_{FWD}$, as a function of load impedance, $Z_L$, is a generally inclined, relatively planar surface 50, as shown in the figure. At the match point where $Z_L=Z_O$, the forward power delivered by the power amplifier is shown as the point labeled 52, i.e., the $P_{FWD}$ axis intersects the power curve 50. As can be seen, the match point is not the point of maximum forward power. In fact, the forward power can increase significantly when $Z_L$ varies in certain directions away from the 50 ohm real impedance value. It is this characteristic which can lead to the unstable conditions that were previously described.

Figure 4:
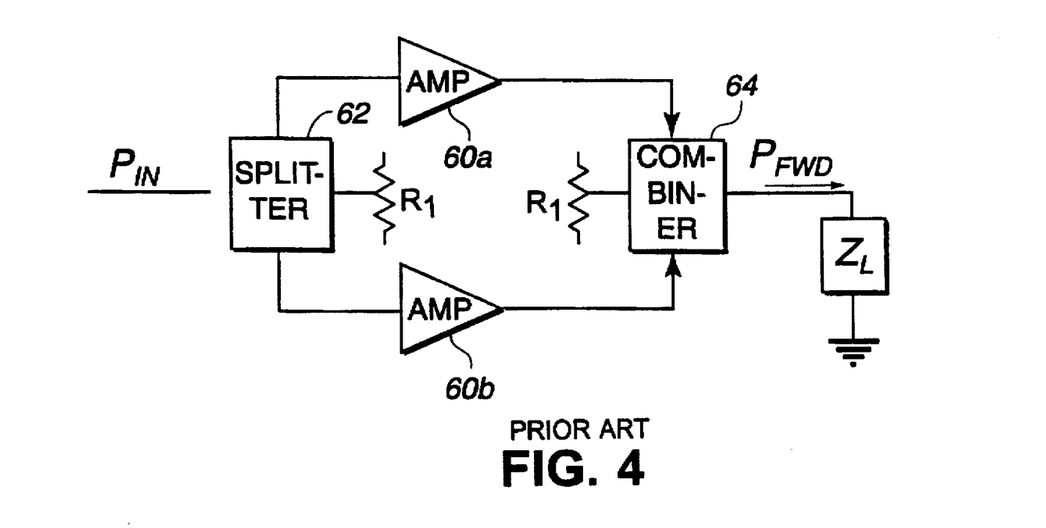
FIG. 4 shows a configuration of a typical high power RF power supply.

Achieving the high power levels that are typically used in plasma processing chambers often requires the combining of multiple stages of RF amplifiers in parallel. An example of a conventional parallel configuration involving two stages is illustrated in FIG. 4. As shown, two identical power amplifiers 60a and 60b are linked together using a power splitter 62 and a power combiner 64. (For a description of the design and operation of power combiners and power splitters see standard textbooks, e.g. *Single-Sideband Systems and Circuit*, Ed. William E. Sabin and Edgar O. Schoenke, McGraw-Hill Book Company, pages 425–447).

Power splitter 62 receives an RF signal, $P_{IN}$, from the RF source and generates therefrom two identical signals of equal power. Each of power amplifiers 60a and 60b amplifies a corresponding one of the signal coming from power splitter 62. The outputs of the amplifiers are then combined in power combiner 64 to produce an output signal with power equal to the sum of the output powers of both power amplifiers 60a and 60b.

In the described embodiment, power combiner 64 is the same type of device as power splitter 62, except operated in reverse. That is, the input lines of the power combiner become the output lines of the power splitter and the output line of the power combiner becomes the input line of the power splitter. These devices also include a power resistor $R_1$ connected to a third port. The power combiner combines its two input signals equally with any amplitude or phase imbalance being absorbed into power resistor $R_1$. In FIG. 4, both power splitter 62 and power combiner 64 are 0° degree devices. That is, the signals appearing on the two lines are in phase with each other. A 180° device is also commercially available. Regardless of which type is used, however, the impedance seen by the output of power amplifier 60a is identical to the impedance seen by the output of power amplifier 60b. Thus, when using a 0° device or a 180° device, the forward power versus $Z_L$ characteristics for both amplifiers 60a and 60b are the same as for the single stage shown in FIG. 3. Thus, if a change in plasma impedance causes an increase in power output of one amplifier, it will also cause a power increase in the other amplifier.

Combining the RF amplifiers in this way has been found to cause the RF power supply-plasma interaction oscillation mentioned above. Because the forward power can increase in both branches when the plasma impedance changes in certain directions, the oscillation can be initiated.

Figure 5:
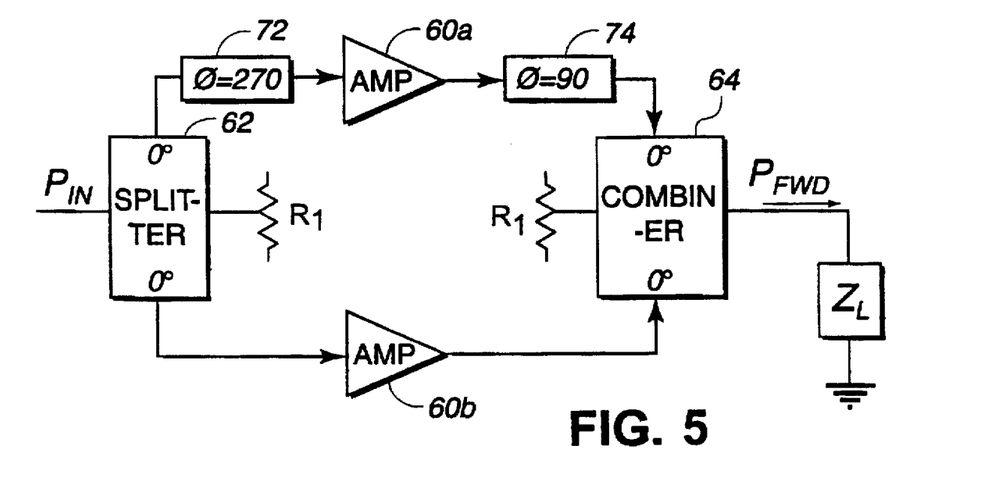
FIG. 5 shows an RF power supply constructed in accordance with the invention.

The potential for instability is completely eliminated by the modifications shown in the circuit of FIG. 5. The modified circuit is identical to the circuit of FIG. 4, except for the addition of phase shifting elements 72 and 74 before and after power amplifier 60a. More specifically, in the described embodiment, a 270°+n(180°)+m(360°) phase shifting element 72 is added before power amplifier 60a and a 90°+n(180°)+k(360°) phase shifting element 74 is added after power amplifier 60a, where n, m, and k are integers which may take on any positive value or zero. Phase shifting element 74 rotates the impedance seen by power amplifier 60a relative to the impedance seen by power amplifier 60b. Phase shifting element 72 adds sufficient phase shift to the signal in the upper branch to produce a signal at the input of power combiner 64 that is in phase with the input signal from the lower branch (i.e., the phase difference between the two inputs is integer multiples of 360°).

Note that phase shifting element 74 could have been inserted before power amplifier 60b instead. In that case, it would need to introduce a phase shift of 90°+n(180°)+m (360°) to satisfy the phase requirements at the input of power combiner 64.

The phase shifting elements 72 and 74 can be simply implemented by using a section of cable having the appropriate length (e.g. a cable having a length of approx. 30" produces a 90° phase shift for a 13.56 MHZ signal).

In the configuration of FIG. 5, if $Z_L$ is exactly 50 ohms real, both power amplifiers 60a and 60b will see a load impedance of 50 ohms real. However, if $Z_L$ is not 50 ohms real (i.e., if the system has moved away from a perfect match condition), power amplifier 60a will see an impedance that is ¼ wavelength (i.e., 90°) out of phase with the impedance seen by power amplifier 60b. More significantly, the power curve of power amplifier 60a will also be ¼ wavelength out of phase relative to the power curve of power amplifier 60b. In other words, if we assume that the power curve for power amplifier 60b is as shown in FIG. 3a, then the power curve for power amplifier 60a will be rotated by 180° about the power axis (i.e., two times 90°). Now, a change in impedance away from the match condition will not cause both power amplifiers to increase their power outputs. If a change in plasma impedance causes the output power of power amplifier 60b to increase, it will cause the output power of power amplifier 60a to decrease. This is a characteristic of all ordinary class A, B, and C power amplifiers so long as the output amplifier output is not limited by the current or voltage capability of the amplifier's power supply. In other words, one power amplifier will tend to compensate for the potentially destabilizing response of the other power amplifier.

Power combiner 64 further assists in stabilizing the power supply in the following way. When the two power amplifiers 60a and 60b produce signals that have equal amplitude, are in phase, and thus have equal forward power, power combiner 64 combines the two signals to produce an output signal having a total forward power that is the sum of the forward power of the two power amplifiers. Since the two input signals to power combiner 64 are in phase and of equal amplitude, power resistor, $R_1$, dissipates no power. However, when the two power amplifiers produce signals that are not in balance, the amplitude imbalance will be absorbed in power resistor, $R_1$.

Figure 6:
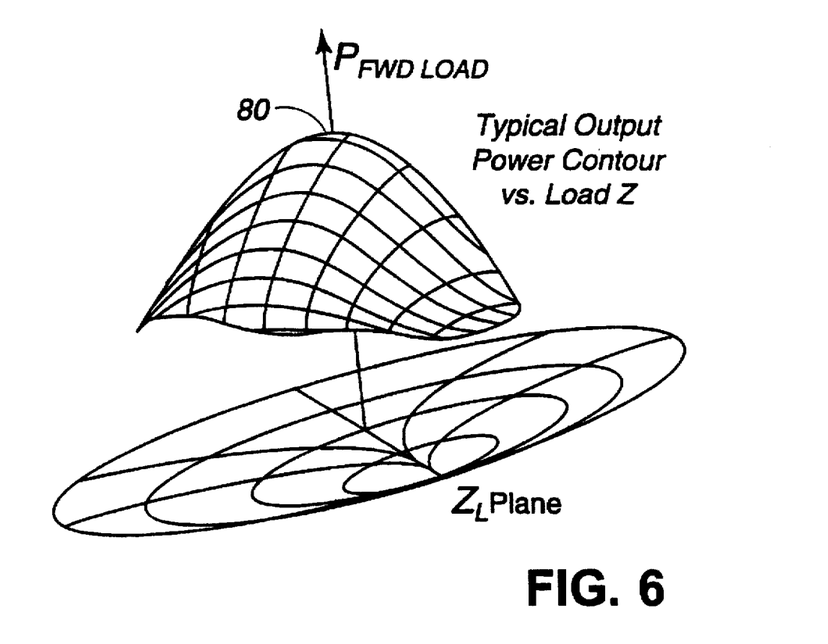
FIG. 6 shows the forward power output contour for the power supply of FIG. 4.

The net effect of phase shifting element 74 and power combiner 64 is to produce a forward power versus $Z_L$ characteristic that appears as shown in FIG. 6. The resulting power curve for the power supply exhibits a maximum 80 at or near the optimum match point. It should be noted, however, that depending upon the particular characteristics of the power amplifiers that are used, a maximum may not actually be located at the match point. Nevertheless, the resulting power curve will have a shape in the vicinity of the optimum match point such that any movement away from the optimum match condition will not cause the power output of the supply to increase significantly (i.e., it will not increase enough to cause an instability of the type previously observed). Indeed, this technique has proven to completely solve the power supply-plasma interaction oscillation problem described above.

The configuration of FIG. 5 is not the only configuration which accomplishes this objective. The key is adding a sufficient phase shift at the output of one power amplifier. As long as the impedances seen by the outputs of two power amplifier stages are sufficiently out of phase, this technique works to eliminate instabilities of the type previously described. In other words, the phase shift at the output of the power amplifier 60b need not be 90°. It can be any amount which causes that power amplifier to compensate for the potentially destabilizing response of the other power amplifier. The amount can be determined empirically for the specific power amplifiers that are used and for the specific configuration. The second phase shift provided by phase shifting element 72 simply satisfies a requirement that exists at the inputs of a 0° combiner, namely, that they must be in phase with each other.

Figure 7:
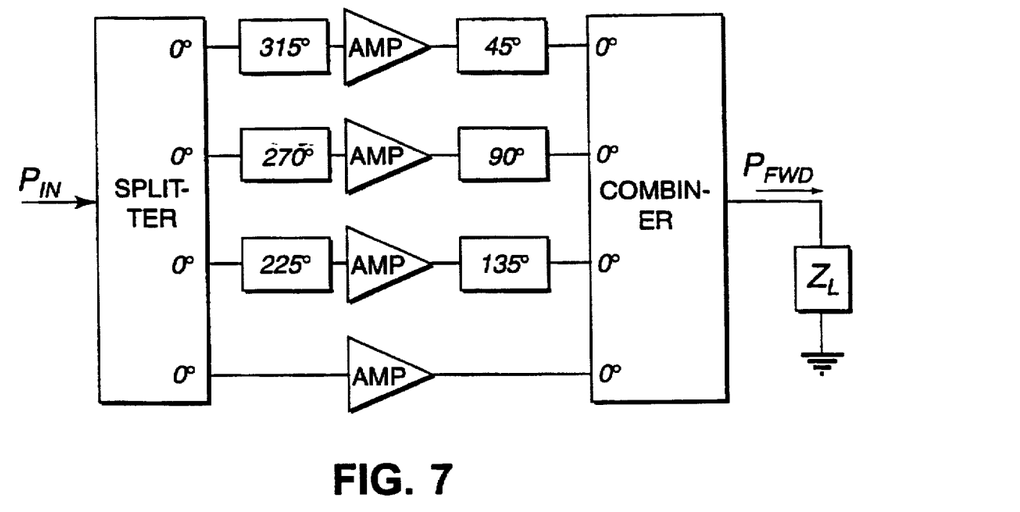
FIG. 7 shows an embodiment of the invention which employs four power amplifiers.

In addition, the technique may also be used in power supplies having more than two stages. If more than two power amplifiers are used, they can be grouped into two groups and each group can then be handled as a single power amplifier of a two stage configuration such as was described above. Alternatively, the power amplifiers can be treated individually. For example, if there are four power amplifiers, such as is shown in FIG. 7, phase shifting elements of 45°, 90°, and 135° can be used at the outputs of three of the power amplifiers. The phase shifting elements operate to rotate the power curve by 90° of one power amplifier relative to its neighbor.

In general, if x stages are used (where x is typically an even integer), then one approach is to use phase shift elements of r(180°/x), where r identifies the stage and r=1,2, ..., x.

Figure 8:
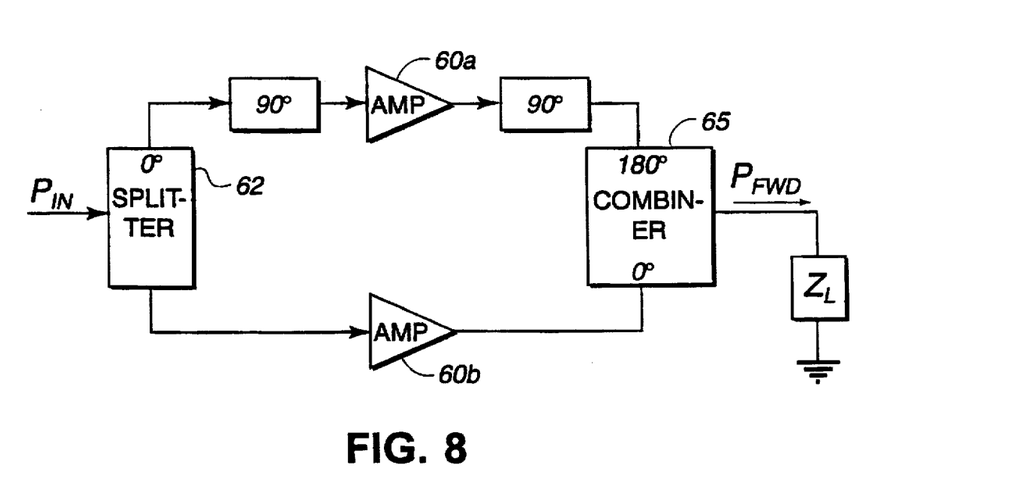
FIG. 8 shows another embodiment using a 180° power combiner.

In another embodiment shown in FIG. 8, a 180° power combiner 65 is used. In that case, a 90°+n(180°)+m(360°) phase shifting element is used in front of power amplifier 60a replacing the 270°+n(180°)+m(360°) phase shifting element previously described. This is necessary since the signals arriving at the inputs of the 180° power combiner must be 180° out of phase.

It should also be possible to use two power amplifiers of different design, each having a power curve that compensates for the power curve of the other amplifier.

Typical power levels that are used in the described embodiment are 1 kW at 13.56 MHZ. The technique, however, works for any frequencies (e.g. RF) and power levels that might be used in a plasma chamber.

Note that for the embodiments described above it should be understood that any connection between the output of the power splitter and the input of a power amplifier or between the output of the power amplifier and the input of the combiner will typically introduce a phase shift in the signal. The amount of phase shift that is introduced will either be small or large depending upon the length of the circuit. Thus, implicit in the figures is a phase shift elements at both the input and outputs of all amplifiers in all of the branches. These are not shown, however, to simplify the description and to highlight that it is the relative difference in phase shift that is important.

Other embodiments of the invention are within the following claims.

What is claimed is:

1. An RF power supply for delivering RF power to a plasma, said supply comprising:

an RF signal generator generating an RF signal having a frequency of $r_{RF}$;

a splitter having an input line receiving said RF signal, a first output line carrying a first output signal derived from said RF signal, and a second output line carrying a second output signal derived from said RF signal;

a first branch circuit receiving said first output signal and generating a first derived signal therefrom, said first branch circuit comprising a first power amplifier and a phase shifting element, said first power amplifier having an output line;

a second branch circuit receiving said second output signal and generating a second derived signal therefrom, said second branch circuit comprising a second power amplifier having an output line;

a combiner having a first input and a second input, said first input receiving said first derived signal and said second input receiving said second derived signal, said combiner combining said first and second derived signals to produce a power output signal therefrom, wherein said phase shifting element is connected between the output line of the first power amplifier and the first input of the combiner and produces a first phase shift in a signal passing from the first power amplifier to the combiner relative to a signal passing from the second power amplifier to the combiner, and wherein said first and second branch circuits also produce at the frequency $r_{RF}$ a total phase shift in the first derived signal relative to the second derived signal that is equal to one of the following two values: s(360°)+360° and s(360°)+180°, wherein s is an integer which may take on any positive value or zero.

2. The RF power supply of claim 1 wherein the first phase shift is sufficient to prevent an oscillatory instability in the RF power amplifier when supplying power to a plasma.

3. The RF power supply of claim 1 wherein the first phase shift is about 45°+n(180°), where n is an integer.

4. The RF power supply of claim 1 wherein the first phase shift is about 90°+n(180°), where n is an integer.

5. The RF power supply of claim 1 wherein said first branch circuit further comprises a second phase shifting element connected between the first output of the splitter and the first power amplifier, said second phase shifting element producing a second phase shift which when added to the phase shift of the first mentioned phase shifting element causes the first derived signal to have a predefined phase relationship with respect to the second derived signal, said predefined phase relationship being determined by requirements of the combiner.

6. The RF power supply of claim 5 wherein the first phase shift and the second phase shift cause the first derived signal to have the following phase relationship with respect to the second derived signal: s(360°)+360°.

7. The RF power supply of claim 6 wherein the first phase shift is about 90°+n(180°)+m(360°), where n and m are integers, and wherein the second phase shift is about 270°+n(180°)+k(360°), where k is an integer.

8. The RF power supply of claim 5 wherein the first phase shift and the second phase shift cause the first derived signal to have the following phase relationship with respect to the second derived signal: 180°+s(360°).

9. The RF power supply of claim 8 wherein the first mentioned phase shift is about 90°+n(180°)+m(360°), where n and m are integers and wherein the second phase shift is about 90°+n(180°)+k(360°), where k is an integer.

10. The RF power supply of claim 5 wherein the first mentioned phase shifting element is a segment of cable of a predetermined length.

11. The RF power supply of claim 10 wherein the second phase shifting element is a segment of cable of a predetermined length.

12. The RF power supply of claim 5 wherein the combiner is a 0° combiner.

13. The RF power supply of claim 5 wherein the combiner is a 180° combiner.

14. The RF power supply of claim 1 wherein said second branch circuit further comprises a second phase shifting element connected between the second output of the splitter and the second power amplifier, said second phase shifting element producing a second phase shift which causes the second derived signal to have a predefined phase relationship with respect to the first derived signal, said predefined phase relationship being determined by requirements of the combiner.

15. An RF plasma system comprising:

an RF signal generator which during operation generates an RF signal;

a splitter having an input line receiving the RF derived from said RF signal, and a second output line carrying a second output signal derived from said RF signal;

a first branch circuit receiving said first output signal and generating a first derived signal therefrom, said first branch circuit comprising a first power amplifier;

a second branch circuit receiving said second output signal and generating a second derived signal therefrom, said second branch circuit comprising a second power amplifier having an output line;

a combiner having a first input, a second input, and an output, said first input receiving said first derived signal and said second input receiving said second derived signal, said combiner combining said first and second derived signals to produce a power output signal therefrom; and a plasma processing chamber in which a plasma is formed during operation, said plasma receiving the power output signal from the combiner, wherein with a plasma present in the chamber, the first power amplifier is characterized by a first forward power curve surface and the second power amplifier is characterized by a second forward power curve surface and wherein the first and second power curve surfaces are oriented with respect each other such that changes in the load that produce an increase in forward power level for the first power amplifier produce a decrease in forward power level for the second power amplifier and vice versa.

16. A plasma processing apparatus comprising:

a plasma processing chamber; and an RF power amplifier supplying power to the plasma processing chamber;

an RF signal generator connected to said RF power amplifier and supplying an RF signal having a frequency $r_{RF}$;

said RF power amplifier comprising:

a splitter having an input line receiving said RF signal, a first output line carrying a first output signal derived from said RF signal, and a second output line carrying a second output signal derived from said RF signal;

a first branch circuit receiving said first output signal and generating a first derived signal therefrom, said first branch circuit comprising a first power amplifier and a phase shifting element, said first power amplifier having an output line;

a second branch circuit receiving said second output signal and generating a second derived signal therefrom, said second branch circuit comprising a second power amplifier having an output line;

a combiner having a first input and a second input, said first input receiving said first derived signal and said second input receiving said second derived signal, said combiner combining said first and second derived signals to produce a power output signal therefrom, wherein said phase shifting element is connected between the output line of the first power amplifier and the first input of the combiner and produces a first phase shift in a signal passing from the first power amplifier to the combiner relative to a signal passing from the second power amplifier to the combiner, and wherein said first and second branch circuits also produce at frequency $r_{RF}$ a total phase shift in the first derived signal relative to the second derived signal that is equal to one of the following two values: $s(360°)+360°$ and $s(360°)+180°$, wherein s is an integer which may take on any positive value or zero.

17. The plasma processing apparatus of claim 16 wherein the first phase shift is about $45°+n(180°)$, where n is an integer.

18. The plasma processing apparatus of claim 16 wherein the first phase shift is about $90°+n(180°)$, where n is an integer.

19. The plasma processing apparatus of claim 16 wherein said first branch circuit further comprises a second phase shifting element connected between the first output of the splitter and the first power amplifier, said second phase shifting element producing a second phase shift which when added to the phase shift of the first mentioned phase shifting element causes the first derived signal to have a predefined phase relationship with respect to the second derived signal, said predefined phase relationship being determined by requirements of the combiner.

20. The plasma processing apparatus of claim 19 wherein the first phase shift and the second phase shift cause the first derived signal to have the following phase relationship with respect to the second derived signal: $s(360°)+360°$.

21. The plasma processing apparatus of claim 20 wherein the first phase shift is about $90°+n(180°)+m(360°)$, where n and m are integers, and wherein the second phase shift is about $270°+n(180°)+k(360°)$, where k is an integer.

22. The plasma processing apparatus of claim 19 wherein the first phase shift and the second phase shift cause the first derived signal to have the following phase relationship with respect to the second derived signal: $180°+s(360°)$.

23. The plasma processing apparatus of claim 22 wherein the first phase shift is about $90°+n(180°)+m(360°)$, where n and m are integers and wherein the second phase shift is about $90°+n(180°)+k(360°)$, where k is an integer.

24. The plasma processing apparatus of claim 19 wherein the first mentioned phase shifting element is a segment of cable of a predetermined length.

25. The plasma processing apparatus of claim 24 wherein the second phase shifting element is a segment of cable of a predetermined length.

26. The plasma processing apparatus of claim 19 wherein the combiner is a 0° combiner.

27. The plasma processing apparatus of claim 19 wherein the combiner is a 180° combiner.

28. A method of supplying RF power to a plasma in a plasma processing chamber, said method comprising:

splitting an RF signal into a first output signal and a second output signal;

power amplifying the first output signal to produce a first amplified signal;

power amplifying the second output signal to produce a second amplified signal;

phase shifting the second amplified signal relative to the first amplified signal to produce a phase shifted signal;

combining the first amplified signal and the phase shifted signal to produce a power output signal therefrom; and delivering the power output signal to the plasma in the plasma processing chamber.

29. The method of claim 28 wherein the phase shifting step produces a phase shift of greater than about 45°.

30. The method of claim 28 wherein the phase shifting step produces a phase shift of about 90°.

31. The method of claim 30 wherein the phase shifting step produces a phase shift of about 90°+n(360°), where n is an integer.

32. The method of claim 28 further comprising phase shifting the second output signal relative to the first output signal prior to amplifying said second output signal.

33. The method of claim 32 wherein the steps of phase shifting the second output signal and phase shifting the second amplified signal cause the phase shifted signal to have a predetermined phase relationship with the first amplified signal, said predetermined phase relationship being determined by requirements of the combiner.

34. The method of claim 33 wherein the steps of phase shifting the second output signal and phase shifting the second amplified signal cause the phase shifted signal to have the following phase relationship with respect to the first amplified signal: s(360°)+360°, wherein s is an integer which may take on any positive value or zero.

35. The method of claim 34 wherein the step of phase shifting the second amplified signal introduces a phase shift of about 90°+n(180°)+m(360°), where n and m are integers, and wherein the step of phase shifting the second output signal introduces a phase shift of about 270°+n(180°)+k (360°), where k is an integer.

36. The method of claim 33 wherein the steps of phase shifting the second output signal and phase shifting the second amplified signal cause the phase shifted signal to have the following phase relationship with respect to the first amplified signal: 180°+s(360°), wherein s is an integer which may take on any positive value or zero.

37. The method of claim 36 wherein the step of phase shifting the second amplified signal introduces a phase shift of about 90°+n(180°)+m(360°), where n and m are integers, and wherein the step of phase shifting the second output signal introduces a phase shift of about 90°+n(180°)+k (360°), where k is an integer.

38. The method of claim 32 wherein the step of phase shifting the second amplified signal comprises using a segment of cable having a predetermined length to perform said phase shifting.

39. The method of claim 38 wherein the step of phase shifting the second output signal using a second segment of cable having a second predetermined length to perform said phase shifting.

* * * * *